US011003279B2

(12) United States Patent
Monson et al.

(10) Patent No.: US 11,003,279 B2
(45) Date of Patent: May 11, 2021

(54) TOUCH SENSOR WITH PERIPHERAL ELECTRODES

(71) Applicant: Cirque Corporation, West Valley, UT (US)

(72) Inventors: Brian Monson, Farmington, UT (US); Jon Alan Bertrand, Taylorsville, UT (US); Douglas Steck, Riverton, UT (US)

(73) Assignee: Cirque Corporation, Sandy, UT (US)

( * ) Notice: Subject to any disclaimer, the term of this patent is extended or adjusted under 35 U.S.C. 154(b) by 0 days.

(21) Appl. No.: 16/719,511

(22) Filed: Dec. 18, 2019

(65) Prior Publication Data

US 2020/0225801 A1 Jul. 16, 2020

Related U.S. Application Data

(60) Provisional application No. 62/792,039, filed on Jan. 14, 2019.

(51) Int. Cl.
G06F 3/041 (2006.01)
G06F 3/044 (2006.01)
H03K 17/96 (2006.01)

(52) U.S. Cl.
CPC .......... G06F 3/0416 (2013.01); G06F 3/0446 (2019.05); H03K 17/9622 (2013.01)

(58) Field of Classification Search
CPC .. G06F 3/0416; G06F 3/04886; G06F 3/0238; G06F 3/044; G06F 1/1601; G06F 1/1616; G06F 1/1626; G06F 1/1684; G06F 1/169; G06F 1/163; G06F 3/0446; G01D 5/24; H03K 17/962; H03K 17/9622
See application file for complete search history.

(56) References Cited

U.S. PATENT DOCUMENTS

| | | | |
|---|---|---|---|
| 6,593,916 B1 | 7/2003 | Aroyan | |
| 2007/0268243 A1* | 11/2007 | Choo | G06F 3/044 345/104 |
| 2010/0164759 A1* | 7/2010 | Kivela | G06F 1/1626 341/22 |
| 2011/0027766 A1* | 2/2011 | Yoo | A61B 3/032 434/262 |
| 2011/0148807 A1* | 6/2011 | Fryer | G06F 3/0202 345/174 |
| 2011/0212774 A1* | 9/2011 | Wudtke | G07F 17/3211 463/30 |
| 2011/0254571 A1* | 10/2011 | Togura | G06F 3/0444 324/679 |
| 2012/0050204 A1 | 3/2012 | Kao | |
| 2014/0002358 A1 | 1/2014 | Bruwer | |
| 2016/0252985 A1* | 9/2016 | Tsai | G06F 1/163 345/173 |
| 2019/0227669 A1 | 7/2019 | Maharyta | |

* cited by examiner

Primary Examiner — Xuemei Zheng

(57) ABSTRACT

An apparatus may include a touch sensor, a touch region of the touch sensor that is free of sense electrodes, a first peripheral region of the touch sensor and a second peripheral region of the touch senor and the touch region is located between the first peripheral region and the second peripheral region, a first sense electrode is located in the first peripheral region, a second sense electrode is located in the second peripheral region.

16 Claims, 5 Drawing Sheets

600

Determine that a measurement from a first sense electrode located outside an area of a touch sensing region is a touch within the touch sensing region where the first electrode is not located within the touch sensing region. — 602

Determine that a measurement from a first sense electrode located outside an area of a touch sensing region is a touch within the touch sensing region where the first electrode is not located within the touch sensing region. — 702

Determine that the touch is closer to the first sense electrode when the measurement from the first sense electrode is stronger than a second, weaker measurement from the second sense electrode that is also located outside of the touch sensing region. — 704

Fig. 7

TOUCH SENSOR WITH PERIPHERAL ELECTRODES

CROSS REFERENCE TO RELATED APPLICATIONS

The present Application claims priority to U.S. Provisional Patent Application No. 62/792,039 by Brian Monson, et al., entitled "Touch Screen with Peripheral Electrodes," filed on Jan. 14, 2019, assigned to the assignee hereof, and expressly incorporated by reference herein.

FIELD OF THE DISCLOSURE

This disclosure relates generally to touch pad devices and methods of operation. More particularly, this disclosure relates to systems and methods for touch screen devices with electrodes positioned around the peripheral edges of the pad.

BACKGROUND

Presently, touch pads and touch screens are almost universal with liquid crystal display (LCD) devices. People naturally see an LCD and try to touch the screen when interacting with the device. One problem associated with this expectation is that a full 2D glass or plastic touch panel can be quite expensive which, in turn, can increase the overall price of the LCD device. For example, one may be able to obtain a 3"×3" LCD panel relatively inexpensively, but to put a transparent touch sensor over top of the LCD to make it active to touch, or otherwise include touch sensing on the LCD device, approximately doubles, or triples, the cost. Accordingly, there is a need to manufacture LCD screens and other touch sensors in more cost-effective ways and potentially open up a number of applications to touch.

Furthermore, many devices that do not include LCD screens often lack touch sensing capability but could benefit from it if economically possible. For example, devices such as battery chargers, thermostats, heaters, fans, vending machines, or the like, where a limited amount of touch sensing (e.g., on/off, speed up/slow down, temperature up/down, select item A or item B, and the like) could benefit from economical touch sensing. Typically, the cost of including capacitive touch sensing is not feasible on such devices.

Other drawbacks, inconveniences, and issues with existing devices and methods also exist.

SUMMARY

Accordingly, disclosed embodiments address the above-noted, and other, drawbacks, inconveniences, and issues with existing devices and methods. Disclosed embodiments include touch sensor systems and methods including a substrate with one or more electrodes positioned on the periphery of a touch sensing region. Embodiments of the electrodes may comprise printed resistive ink electrodes that are relatively inexpensive to manufacture. Other embodiments, advantages, and features also exist.

In some examples, an apparatus may include a touch sensor, a touch sensing region of the touch sensor that is free of sense electrodes, a first peripheral region of the touch sensor and a second peripheral region of the touch senor and the touch sensing region is located between the first peripheral region and the second peripheral region, a first sense electrode is located in the first peripheral region, and a second sense electrode is located in the second peripheral region.

The apparatus may include at least touch indicia that overlaps with a region of the touch sensor that is free of sense electrodes.

The touch indicia may be a button.

The touch indicia may be a decal.

The apparatus may be a liquid crystal panel.

The touch sensor may have a dimension that is less than three inches wide or three inches in length.

The apparatus may include a transmit electrode in communication with the first sense electrode and the second sense electrode.

The transmit electrode may be outside of the touch region.

The first sense electrode may be one of multiple sense electrodes disposed within the first peripheral region.

The touch sensing region is free of transmit electrodes.

In some examples, an apparatus may include a touch sensor, a touch sensing region of the touch sensor, a first peripheral region of the touch sensor and a second peripheral region of the touch sensor where the touch sensing region is located between the first peripheral region and the second peripheral region, a first sense electrode is located in the first peripheral region, a second sense electrode is located in the second peripheral region, and a touch controller in communication with the first sense electrode and the second sense electrode, memory of the touch controller where the memory includes programmed instructions that, when executed, cause the touch controller to determine that a measurement from at least one of the first sense electrode or the second sense electrode from outside the touch sensing region is a touch that overlaps with the touch sensing region of the touch sensor.

The programmed instructions may be configured to determine that the touch correlates with a selection of indicia that overlaps with the touch sensing region.

The programmed instructions, when executed, may cause the touch controller to determine that the touch is closer to the first sense electrode when the measurement from the first sense electrode is stronger than a second, weaker measurement from the second sense electrode.

The programmed instructions may be configured to determine that the touch correlates with a selection of a first indicia closer to the first sense electrode of multiple indicia.

The apparatus may include a transmit electrode in communication with the first sense electrode and the second sense electrode.

The transmit electrode may be outside of the touch sensing region.

The first sense electrode may be one of multiple sense electrodes disposed within the first peripheral region.

The touch sensing region may be free of transmit electrodes.

In some examples, a computer-program product for a touch sensor, the computer-program product comprising a non-transitory computer-readable medium storing instructions executable by a processor to determine that a measurement from a first sense electrode located outside an area of a touch sensing region is a touch within the touch sensing region where the first electrode is not located within the touch sensing region.

The instructions may be executable by the processor to determine that the touch is closer to the first sense electrode when the measurement from the first sense electrode is stronger than a second, weaker measurement from the second sense electrode that is also located outside of the touch sensing region.

BRIEF DESCRIPTION OF THE DRAWINGS

FIG. 6 is an example of a method of using a touch sensor in accordance with disclosed embodiments.

FIG. 7 is an example of a method of using a touch sensor in accordance with disclosed embodiments.

Figure 1:
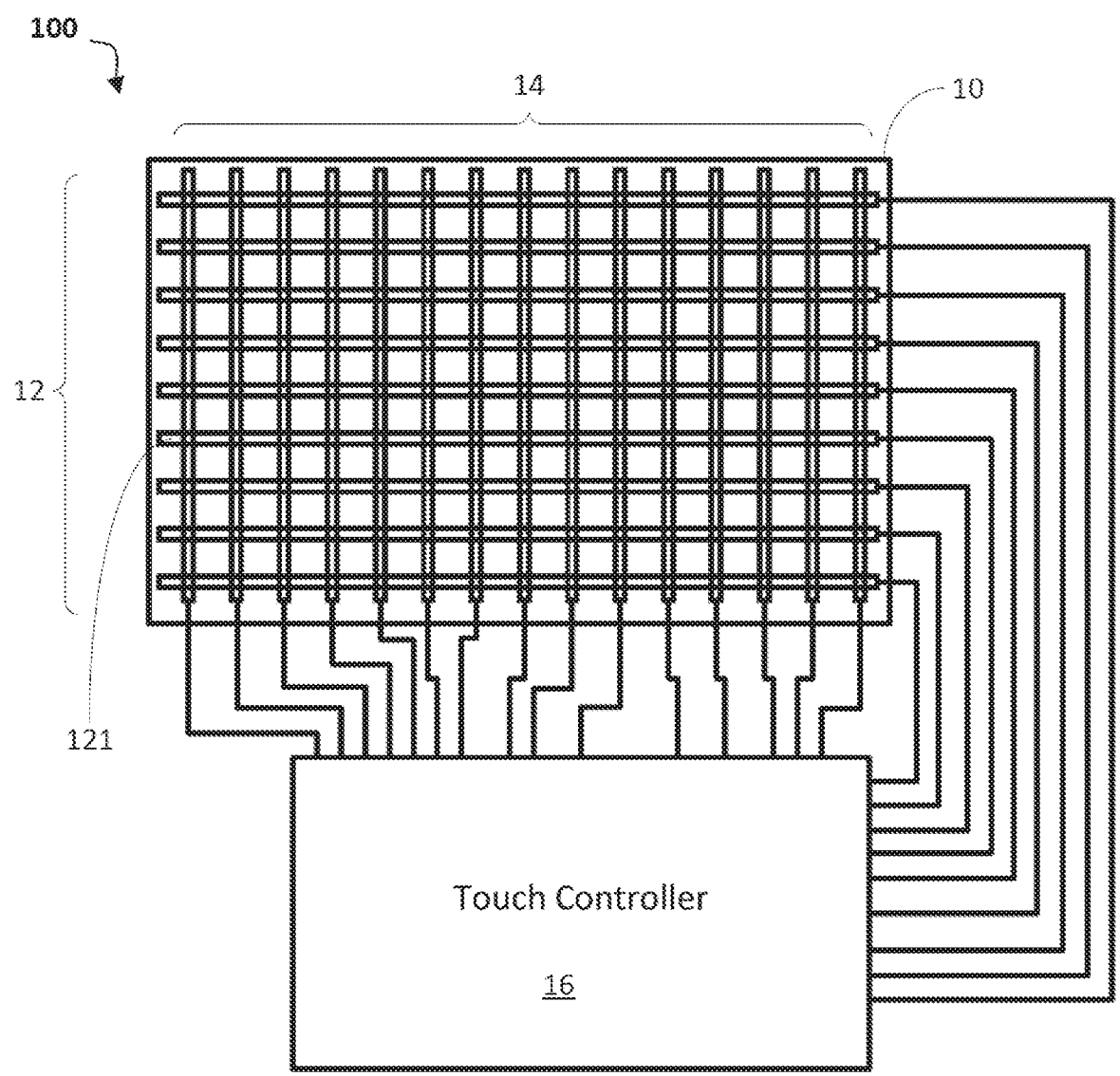
FIG. 1 is a schematic block diagram of an example of a capacitive touchpad system.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the spirit and scope of the invention as defined by the appended claims.

DETAILED DESCRIPTION OF THE INVENTION

This description provides examples, and is not intended to limit the scope, applicability or configuration of the invention. Rather, the ensuing description will provide those skilled in the art with an enabling description for implementing embodiments of the invention. Various changes may be made in the function and arrangement of elements.

Thus, various embodiments may omit, substitute, or add various procedures or components as appropriate. For instance, it should be appreciated that the methods may be performed in an order different than that described, and that various steps may be added, omitted, or combined. Also, aspects and elements described with respect to certain embodiments may be combined in various other embodiments. It should also be appreciated that the following systems, methods, devices, and software may individually or collectively be components of a larger system, wherein other procedures may take precedence over or otherwise modify their application.

For purposes of this disclosure, the term "aligned" generally refers to being parallel, substantially parallel, or forming an angle of less than 35.0 degrees. For purposes of this disclosure, the term "transverse" generally refers to perpendicular, substantially perpendicular, or forming an angle between 55.0 and 125.0 degrees. For purposes of this disclosure, the term "length" generally refers to the longest dimension of an object. For purposes of this disclosure, the term "width" generally refers to the dimension of an object from side to side and may refer to measuring across an object perpendicular to the object's length.

For purposes of this disclosure, the term "electrode" generally refers to a portion of an electrical conductor intended to be used to make a measurement, and the terms "route" and "trace" generally refer to portions of an electrical conductor that are not intended to make a measurement. For purposes of this disclosure in reference to circuits, the term "line" generally refers to the combination of an electrode and a "route" or "trace" portions of the electrical conductor. For purposes of this disclosure, the term "Tx" generally refers to a transmit line, and the term "Rx" generally refers to a sense line.

It should be understood that use of the terms "touch pad" and "touch sensor" throughout this document may be used interchangeably with "capacitive touch sensor," "capacitive sensor," "capacitive touch and proximity sensor," "proximity sensor," "touch and proximity sensor," "touch panel," "touchpad," and "touch screen."

It should also be understood that, as used herein, the terms "vertical," "horizontal," "lateral," "upper," "lower," "left," "right," "inner," "outer," etc., can refer to relative directions or positions of features in the disclosed devices and/or assemblies shown in the Figures. For example, "upper" or "uppermost" can refer to a feature positioned closer to the top of a page than another feature. These terms, however, should be construed broadly to include devices and/or assemblies having other orientations, such as inverted or inclined orientations where top/bottom, over/under, above/below, up/down, and left/right can be interchanged depending on the orientation.

The present invention utilizes touchpad technology from CIRQUE® Corporation. Accordingly, it is useful to understand operation of the touchpad technology to a degree. The touchpad technology from CIRQUE® Corporation is a mutual capacitance sensing device 100 and an example is illustrated in FIG. 1. For this device 100 a touchpad 10 having a grid of row 12 and column 14 electrodes is used to define the touch-sensitive area of the touchpad 10. Typically, the touchpad is configured as a rectangular grid of an appropriate number of electrodes (e.g., 8-by-6, 16-by-12, 9-by-15, or the like).

As shown in FIG. 1, the mutual capacitance sensing device 100 also includes a touch controller 16. Touch controller 16 typically includes at least one of a central processing unit (CPU), a digital signal processor (DSP), an analog front end (AFE) including amplifiers, a peripheral interface controller (PIC), another type of microprocessor, and/or combinations thereof, and may be implemented as an integrated circuit, a field programmable gate array (FPGA), an application specific integrated circuit (ASIC), a combination of logic gate circuitry, other types of digital or analog electrical design components, or combinations thereof, with appropriate circuitry, hardware, firmware, and/or software to choose from available modes of operation.

Typically, touch controller 16 also includes at least one multiplexing circuit to alternate which of the row 12 or column 14 electrodes are operating as a drive electrode or a sense electrode. The driving electrodes can be driven one at a time in sequence, or randomly, or all at the same time in encoded patterns. Other configurations are possible such as self-capacitance mode where the electrodes are driven and sensed simultaneously. Electrodes may also be arranged in non-rectangular arrays, such as radial patterns, linear strings, or the like. As also indicated in FIG. 1, a ground plane shield 18 may be provided beneath the electrodes 12, 14, to reduce noise or other interference. Shield 18 is shown as extending beyond electrodes 12, 14 merely for ease of illustration. Other configurations are also possible.

Typically, no fixed reference point is used for measurements. Touch controller 16 generates signals that are sent directly to the row 12 and column 14 electrodes in various patterns.

The touchpad 10 does not depend upon an absolute capacitive measurement to determine the location of a finger (or stylus, pointer, or other object) on the touchpad 10 surface. The touchpad 10 measures an imbalance in electrical charge to the electrode functioning as a sense electrode (exemplarily illustrated as row electrode 121 in FIG. 1, but can be any of the row 12, column 14, or other dedicated-sense electrodes). When no pointing object is on or near the touchpad 10, the touch controller 16 is in a balanced state, and there is no signal on the sense electrode (e.g., electrode 121). When a finger or other pointing object creates imbalance because of capacitive coupling, a change in capacitance occurs on the plurality of electrodes 12, 14 that comprise the touchpad electrode grid. What is measured is the change in capacitance, and not the absolute capacitance value on the electrodes 12, 14.

In some cases, the touch screens may be liquid crystal displays (LCD), organic light emitting diodes (OLED) screens, light emitting diodes (LED) screens, plasma displays, or other types of display. In some cases, this screens may have one or just a few buttons that a user can select. In these situations, where the options on the screen are limited, having a fully integrated touch sensor may not be necessary. A less expensive option may be to remove electrodes from one or more touch sensing regions of the touch sensor that correspond with buttons or other types of indicia. Sense electrodes may be positioned outside of the touch sensing areas and when a user touches the touch sensing regions, the sense electrodes outside of the touch sensing region may measure a change in capacitance indicating a touch input. In some cases, multiple sense electrodes may be positioned outside of the touch sensing regions of the touch sensor and when these different sense electrodes register different measurements, the different measurements may be used to determine which of the buttons or other types of indicia were selected from within the touch sensing region. For example, when a sense electrode adjacent to a first side of the touch sensing region registers a greater change in capacitance than another sense electrode located adjacent to a second side that is opposite of the first side of the touch sensing region, than the touch controller or other processing resources may determine that the touch is closer to the first side of the touch sensing region. In this example, if there are only two buttons on the screen, a first button positioned closer to the first side and a second button positioned closer to the second side, then the touch controller may determine that the touch was made at the first button positioned closer to the first side since the first sense electrode measured the greater chance in capacitance.

In some cases, the touch sensor may have to be limited in size for the sense electrodes located outside of the touch sensing region to detect enough of a change to determine that a touch has been made. For example, in some cases, the screen may have a width that is five inches or less, that is three inches or less, that 2.5 inches or less, that is two inches or less, that is 1.5 inches or less, that is one inch or less, that is half an inch or less, another width, or combinations thereof. Further, in some cases, the touch sensor may have a length that is five inches or less, that is three inches or less, that 2.5 inches or less, that is two inches or less, that is 1.5 inches or less, that is one inch or less, that is half an inch or less, another length, or combinations thereof.

The present disclosure describes multiple examples of using electrodes around the outside of a touch sensing area, such as the area that overlaps with a liquid crystal display, another type of display, or another area of the touch sensor designated as a touch sensing region. While positioned outside of the touch sensing region, the sense electrodes are sensitive enough to sense objects touching the touch sensor or the proximity of objects to the touch sensor. In some cases, the sensitivity in the touch sensing region is limited to just the edges of the screen are touch sensitive. However, in other examples, the sensitivity in the touch sensing region is effective across the entire screen.

The electrodes located outside of the touch sensing region may be sense electrodes, transmit electrodes, self-capacitance electrodes, mutual capacitance electrodes, other types of electrodes, or combinations thereof. In some cases, the electrodes are arranged in a driven shield mode to give directivity to the finger or other type of object's location. Using the right measurements, a finger or other object on the outside bezel could be rejected as a touch and a finger or other object inside the touch sensing region could be properly detected.

In some cases, the electrodes on the outside of the touch sensing region work for the touch inputs on the inside the touch sensing region. Mutual capacitance measurements may give directivity to the touch inputs. In some cases, a drive/sense measurement from one side of the screen to the other may be used to prevent accidental touch being registered from a touch input that originates outside of the touch sensing region.

Figure 2:
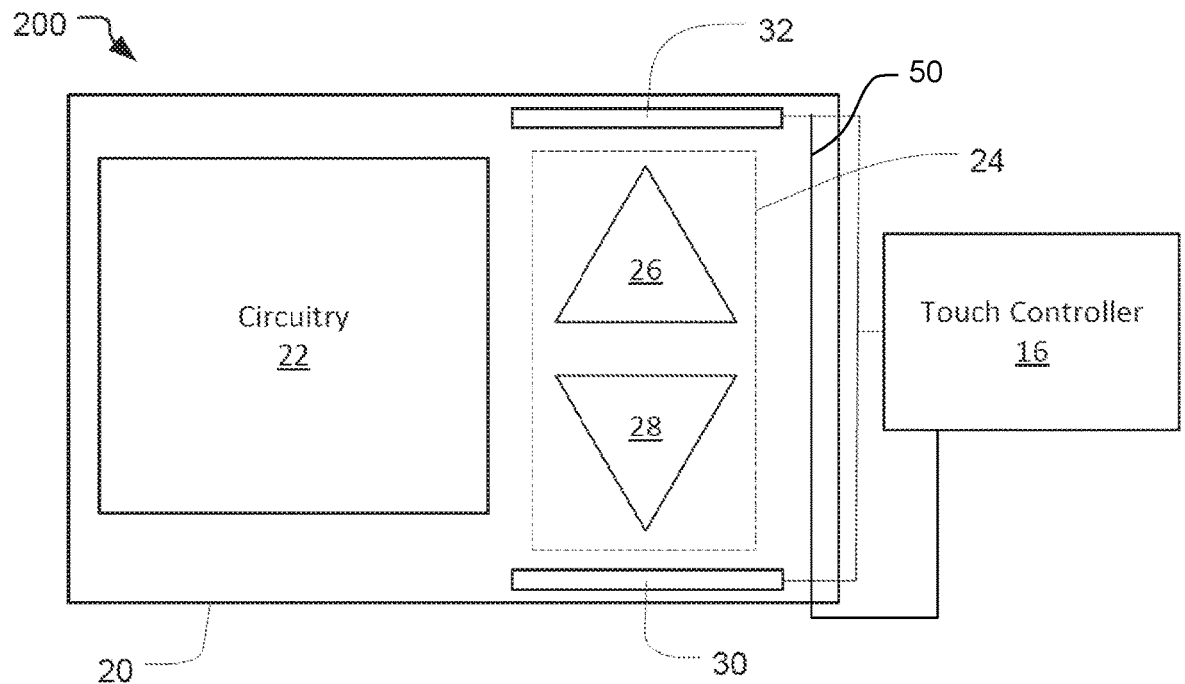
FIG. 2 is a schematic of a touch sensor system with electrodes on the periphery of the touch region in accordance with disclosed embodiments.

FIG. 2 is a schematic of a touch sensor system 200 with electrodes on the periphery of the touch region in accordance with disclosed embodiments. As indicated, touch sensor system 200 may include an LCD screen, a printed circuit board (PCB) or other suitable substrate 20 that includes the circuitry 22 for operating the device that the touch sensor system 200 is part of (e.g., a thermostat, fan, etc.,). As indicated schematically by the dashed line, touch sensor system 200 may also include a touch sensing region 24 for which the sensing of a touch (e.g., by a finger, stylus, or the like) may be beneficial. For example, touch sensor system 200 may be a thermostat that includes a touch sensing region 24 for a user to input a temperature increase by touching "up" icon 26, or to input a temperature decrease by touching "down" icon 28. As a person of ordinary skill in the art having the benefit of this disclosure would understand, other icons 26, 28 and touch sensing region 24 sizes and shapes are also possible.

In some embodiments, touch sensing region 24 may be an LCD screen or just an open area on substrate 20. In other words, substrate 20 may include some open space to incorporate the touch sensing region 24 on a single PCB or the like. In other embodiments, touch sensing region 24 may comprise a stand-alone or otherwise separate component.

Furthermore, icons 26, 28 may comprise printed or painted icons on the substrate 20, decals, stickers, raised, depressed, or otherwise tactile regions, or the like. In other embodiments, touch sensing region 24 need not include any icons 26, 28 or other marks. As a person of ordinary skill in the art having the benefit of this disclosure would understand, whether any icons 26, 28 are included, as well as their appearance, will vary according to the device that touch sensor system 200 is included on, and the desired touch inputs for the same.

As also shown, mutual capacitance sensing embodiments of touch sensor system 200 include a first sense electrode 30 and a second sense electrode 32 positioned on the peripheral edges of touch sensing region 24 and controlled by touch controller 16. Embodiments of electrodes 30, 32 may comprise a printed, carbon resistive ink trace on substrate 20, or the like. Further, as a person of ordinary skill in the art having the benefit of this disclosure would understand, the locations of first sense electrode 30 and second sense electrode 32 are merely exemplary and the locations may be swapped, moved to the other sides of touch sensing region 24 or the like. Additionally, embodiments of touch sensor system 200 may share electrodes 30, 32 with each alternating as drive and sense electrodes under the control of touch controller 16, or touch sensor system 200 may use self-capacitance sensing with both electrodes 30, 32 being driven and the load on each being detected by touch controller 16. Further, embodiments of touch sensor system 200 may connect one of the electrodes 30, 32 to a ground and sense changes in the field gradient due to touches in touch sensor region 24. Other configurations drive modes, sense modes, and the like are also possible.

In the example of FIG. 2, a transmit electrode 50 may be positioned to cross the first sense electrode 30 and the second sense electrode 32. In this example, the transmit electrode 50 is located in the periphery of the substrate 20 and outside of the touch sensing region 24. However, in other examples, the transmit electrode 50 may be positioned on another portion of the substrate 20, which may include a portion of the transmit electrode crossing into the touch sensing region 24.

Figure 3:
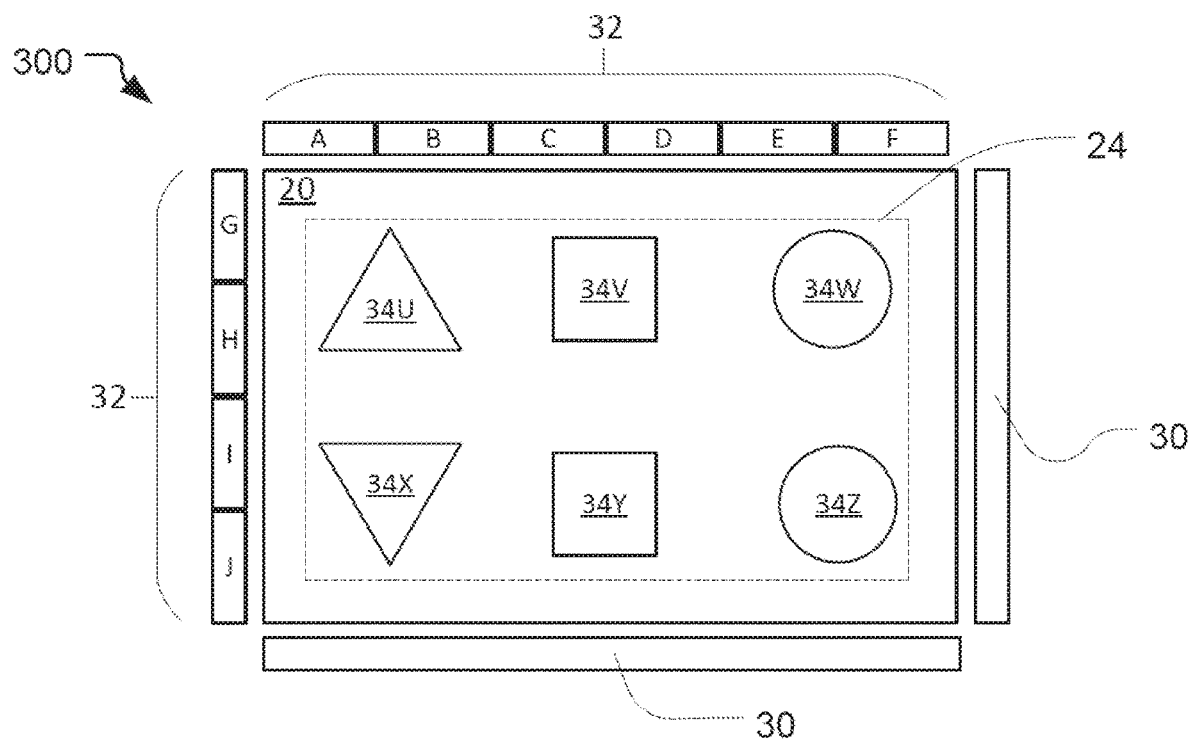
FIG. 3 is a schematic illustration of a touch sensor system with electrodes on the periphery of the touch region in accordance with disclosed embodiments.

FIG. 3 is a schematic illustration of a touch sensor system 300 with electrodes on the periphery of the touch region in accordance with disclosed embodiments. As shown, embodiments of touch sensor system 300 may include several icons 34U-Z in touch sensing region 24. For these, and other, embodiments it may also be desirable to segment the sense electrodes 32 into a number of segments (i.e., A-J) in order to facilitate sensing of the particular icon 34 that is being touched. For example, a touch on icon 34Y may be sensed from changes in capacitance at electrode segments 32C, 32D, 32I, and 32J, and a touch on icon 34W may be sensed at electrode segments 32E, 32F, 32G, and 32H. The number of electrode segments and locations may be varied as desired. Further, as discussed in connection with FIG. 2, depending on the intended application, sensing mode (e.g., mutual capacitance, self-capacitance, driven shielded mode, etc.), touch region size or shape, and the like, other configurations, connections, drive patterns, sense patterns, and the like may be implemented. Likewise, sense electrodes 32 and drive electrodes 30 may be swapped, or shared, and drive electrodes 30 may also be segmented. Other configurations are also possible. A touch controller and connections to the electrodes are not shown in FIG. 3 for simplicity, however, touch sensor system 300 may include them.

Figure 4:
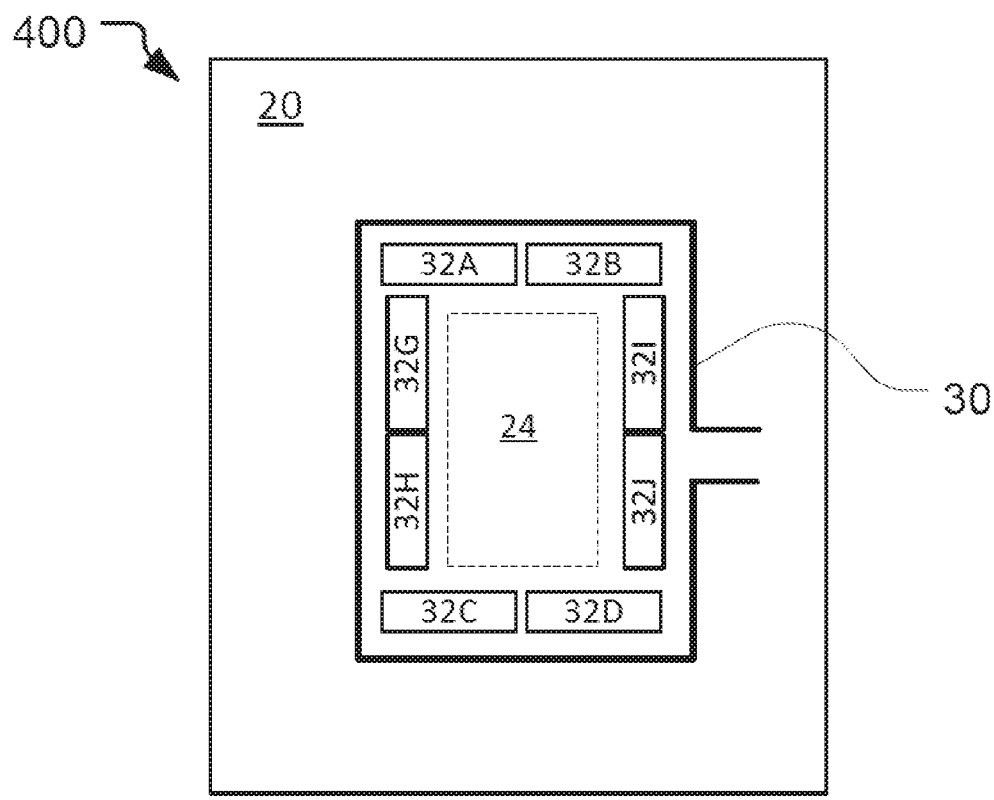
FIG. 4 is a schematic illustration of a touch sensor system with electrodes on the periphery of the touch region in accordance with disclosed embodiments.

FIG. 4 is a schematic illustration of a touch sensor system 400 with electrodes on the peripheral of the touch region in accordance with disclosed embodiments. As shown, embodiments of touch sensor system 400 may include a coil or loop-shaped drive electrode 30 (or the loop may function as a sense electrode) and a number of segmented sense electrodes 32A-D and 32G-J (again, touch controller and electrode connections omitted in FIG. 4 for simplicity). As one of ordinary skill in the art having the benefit of this disclosure would understand, touches in touch sensing region 24 may be detected as described herein.

Figure 5:
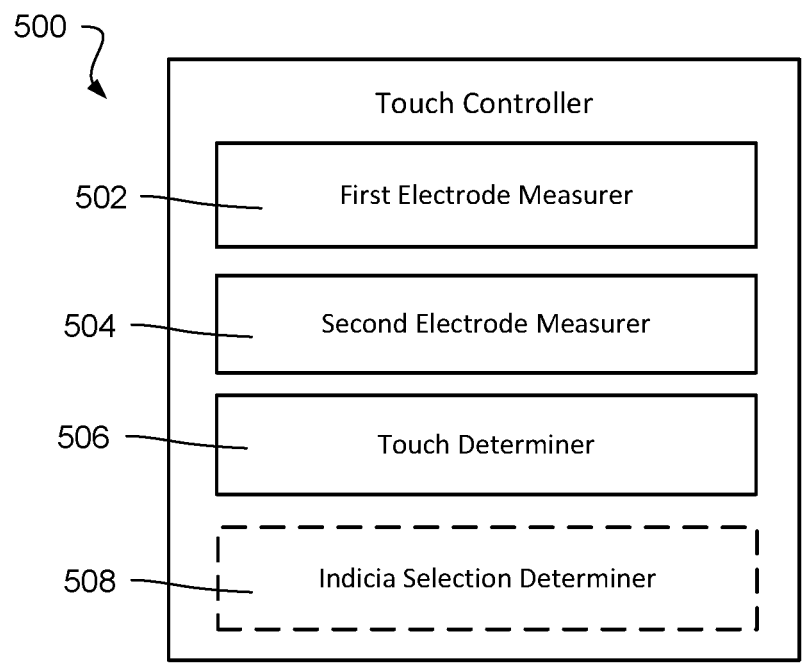
FIG. 5 is a schematic illustration of a touch controller in accordance with disclosed embodiments.

FIG. 5 depicts an example of a touch controller 500. In this example, the touch controller 500 includes programmed instructions in memory and may include associated firmware, logic, processing resources, memory resources, power sources, processing resources, hardware, or other types of hardware to carry out the tasks of the touch controller 500. The touch controller 500 includes a first electrode measurer 502, a second electrode measurer 504, and a touch determiner 506. In some examples, the touch controller 500 may optionally include an indicia selection determiner 508.

The first electrode measurer 502 may read a change of capacitance off of the first sense electrode 502. The second electrode measurer 504 may read a change of capacitance off of the second sense electrode 504.

The touch determiner 506 may determine whether a touch input (e.g. a touch of the touch sensor or the proximity of a finger or other type of object) was made within the touch sensing region. In one example, the touch determiner 506 determines that the only button in the touch sensing region is selected when just the first sense electrode senses a change in capacitance over a predetermined threshold. In another example, the touch determiner 506 determines that the only button in the touch sensing region is selected when just the second sense electrode senses a change in capacitance over a predetermined threshold. In yet another example, the touch determiner 506 determines that the only button in the touch sensing region is selected when the first sense electrode and the second sense electrode both sense a change in capacitance over a predetermined threshold, even if the measurements on the first and second sense electrodes are different.

In those examples with an indicia selection determiner 508, the indicia selection determiner 508 may determine which indicia on the screen is selected base on the measurements from the electrodes. In some examples, the indicia is a button (e.g. an icon or another type of image) generated by the display. In other examples, the indicia is a decal that can be removed from the screen. In another example, the indicia is a physical feature, such as recesses, protrusions, braille features, other tactile features, or combinations thereof. In this type of example, the touch sensing region may be divided into separate areas that are associated with each of the indicia.

As an example, the indicia selection determiner 508 may determine that a first button located closer to the first sense electrode is selected when just the first sense electrode measures a change in capacitance. In yet another example, the indicia selection determiner 508 may determine that a second button located closer to the second sense electrode is selected when just the second sense electrode measures a change in capacitance.

In another example, the indicia selection determiner 508 may determine that a first button located closer to the first sense electrode is selected when the first sense electrode measures a greater change in capacitance than a change of capacitance measured with the second sense electrode. Additionally, the indicia selection determiner 508 may determine that a second button located closer to the second sense electrode may be selected when the second sense electrode measures a greater change in capacitance than a change of capacitance measured with the first sense electrode.

In some cases, the touch sensing region may overlap with more than two buttons on the screen and more than two sense electrodes may be positioned peripherally to, but outside of, the touch sensing region. In some of these examples, the button determined to be selected by the indicia selection determiner 508 may depend on the different changes of capacitance sensed with the different sense electrodes. For example, if multiple sense electrodes measure a greater change in capacitance that are located in generally the same area of the touch sensing region, it may be determined that the button in that area is the selected button. In other examples, when those sense electrodes that align in an x-coordinate or a y-coordinate of the touch sensing region, the touch determiner 506 may determine that a button corresponding to those x- and y-coordinates is selected.

FIG. 6 depicts an example of a method 600 of using a touch sensor. This method 600 may be performed based on the description of the devices, module, and principles described in relation to FIGS. 1-5. In this example, the method 600 includes determining 602 that a measurement from a first sense electrode located outside an area of a touch sensing region is a touch within the touch sensing region where the first electrode is not located within the touch sensing region.

FIG. 7 depicts an example of a method 700 of using a touch sensor. This method 700 may be performed based on the description of the devices, module, and principles described in relation to FIGS. 1-5. In this example, the method 700 includes determining 702 that a measurement from a first sense electrode located outside an area of a touch sensing region is a touch within the touch sensing region where the first electrode is not located within the touch sensing region, and determine 704 that the touch is closer to the first sense electrode when the measurement from the first sense electrode is stronger than a second, weaker measurement from the second sense electrode that is also located outside of the touch sensing region.

It should be noted that the methods, systems and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted or combined. Also, features described with respect to certain embodiments may be combined in various other embodiments. Different aspects and elements of the embodiments may be combined in a similar manner. Also, it should be emphasized that technology evolves and, thus, many of the elements are exemplary in nature and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

The invention claimed is:

1. An apparatus, comprising:
   a touch sensor incorporated into a display;
   a touch sensing region of the touch sensor that is free of sense electrodes where the touch sensing region overlaps with the display;
   a first peripheral region of the touch sensor and a second peripheral region of the touch senor and the touch sensing region is that located between the first peripheral region and the second peripheral region;
   a first sense electrode that is located in the first peripheral region;
   a second sense electrode that is located in the second peripheral region;
   a transmit electrode in communication with the first sense electrode and the second sense electrode; and
   a touch controller in communication with the first sense electrode, the second sense electrode, and the transmit electrode through wired electrical connections.

2. The apparatus of claim 1, further comprising at least touch indicia that overlaps with a region of the touch sensor that is free of sense electrodes.

3. The apparatus of claim 2, wherein the touch indicia is a button.

4. The apparatus of claim 2, wherein the touch indicia is a decal.

5. The apparatus of claim 1, wherein the apparatus is a liquid crystal panel.

6. The apparatus of claim 1, wherein the touch sensor has a dimension that is less than three inches wide or three includes in length.

7. The apparatus of claim 1, wherein the transmit electrode is outside of the touch sensing region.

8. The apparatus of claim 1, wherein the first sense electrode is one of multiple sense electrodes disposed within the first peripheral region.

9. The apparatus of claim 1, wherein the touch sensing region is free of transmit electrodes.

10. An apparatus, comprising:
    a touch sensor incorporated into a display;
    a touch sensing region of the touch sensor where the touch sensing region overlaps with the display;
    a first peripheral region of the touch sensor and a second peripheral region of the touch sensor where the touch sensing region is located between the first peripheral region and the second peripheral region;
    a first sense electrode that is located in the first peripheral region;
    a second sense electrode that is located in the second peripheral region; and
    a touch controller in communication with the first sense electrode and the second sense electrode through wired electrical connections;
    wherein the first sense electrode is one of multiple sense electrodes disposed within the first peripheral region;
    memory of the touch controller where the memory includes programmed instructions that, when executed, cause the touch controller to:
        use self-capacitance sensing where at least one of the first sense electrode and the second sense electrode is driven with an electrical voltage and the load on that same sense electrode is measured; and
        determine that a self-capacitance sensing measurement from at least one of the first sense electrode or the second sense electrode from outside the touch sensing region is a touch within the touch sensing region.

11. The apparatus of claim 10, wherein the programmed instructions are configured to determine that the touch correlates with a selection of indicia that overlaps with the touch sensing region.

12. The apparatus of claim 10, wherein the programmed instructions, when executed, cause the touch controller to determine that the touch is closer to the first sense electrode when the measurement from the first sense electrode is stronger than a second, weaker measurement from the second sense electrode.

13. The apparatus of claim 12, wherein the programmed instructions are configured to determine that the touch correlates with a selection of a first indicia out of a group of multiple indicia, where the first indicia closer to the first sense electrode than other indicia in the group of multiple indicia.

14. The apparatus of claim 10, wherein the touch sensing region is free of transmit electrodes.

15. A computer-program product for a touch sensor, the computer-program product comprising a non-transitory computer-readable medium storing instructions executable by a processor to:

determine, at a touch controller, that a measurement from a first sense electrode located outside an area of a touch sensing region is a touch within the touch sensing region where the first sense electrode is not located within the touch sensing region;

wherein a transmit electrode is in communication with the first sense electrode;

wherein the first sense electrode and the transmit electrode are electrically connected to the touch controller through wired electrical connections; and wherein the touch sensing region overlaps with a display.

16. The computer-program product of claim 15, wherein the instructions are executable by the processor to:

determine, at the touch controller, that the touch is closer to the first sense electrode when the measurement from the first sense electrode is stronger than a second, weaker measurement from a second sense electrode that is also located outside of the touch sensing region;

wherein the first electrode is electrically connected to the touch controller through the wired electrical connections.

* * * * *